(12) United States Patent
O'Brien et al.

(10) Patent No.: US 11,462,678 B2
(45) Date of Patent: Oct. 4, 2022

(54) PERPENDICULAR SPIN TRANSFER TORQUE MEMORY (PSTTM) DEVICES WITH ENHANCED THERMAL STABILITY AND METHODS TO FORM THE SAME

(71) Applicant: Intel Corporation, Santa Clara, CA (US)

(72) Inventors: Kevin O'Brien, Portland, OR (US);
Kaan Oguz, Beaverton, OR (US);
Charles Kuo, Hillsboro, OR (US);
Mark Doczy, Beaverton, OR (US);
Noriyuki Sato, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 204 days.

(21) Appl. No.: 16/955,723

(22) PCT Filed: Mar. 9, 2018

(86) PCT No.: PCT/US2018/021737
§ 371 (c)(1),
(2) Date: Jun. 18, 2020

(87) PCT Pub. No.: WO2019/172928
PCT Pub. Date: Sep. 12, 2019

(65) Prior Publication Data
US 2021/0013397 A1     Jan. 14, 2021

(51) Int. Cl.
*H01L 43/02*      (2006.01)
*H01L 27/22*      (2006.01)
(Continued)

(52) U.S. Cl.
CPC ............ *H01L 43/02* (2013.01); *H01L 27/228* (2013.01); *H01L 43/10* (2013.01); *H01L 43/12* (2013.01)

(58) Field of Classification Search
CPC ......... H01L 43/02; H01L 43/10; H01L 43/12; H01F 10/3254; H01F 10/3272; H01F 10/3286; H01F 41/302
See application file for complete search history.

(56) References Cited

U.S. PATENT DOCUMENTS

| 8,796,797 B2 | 8/2014 | Doyle et al. |
| 10,720,572 B1 | 7/2020 | Fitelson et al. |

(Continued)

FOREIGN PATENT DOCUMENTS

| JP | 2012043913 | 3/2012 |
| WO | 2017151735 | 9/2017 |

OTHER PUBLICATIONS

International Search Report & Written Opinion dated Nov. 28, 2018 for PCT Patent Application No. PCT/US2018/021737.
(Continued)

*Primary Examiner* — Trang Q Tran
(74) *Attorney, Agent, or Firm* — Essential Patents Group, LLP

(57) ABSTRACT

A pSTTM device includes a first electrode and a second electrode, a free magnet between the first electrode and the second electrode, a fixed magnet between the first electrode and the second electrode, a tunnel barrier between the free magnet and the fixed magnet, a coupling layer between the free magnet and the first electrode, where the coupling layer comprises a metal and oxygen and a follower between the coupling layer and the first electrode, wherein the follower comprises a magnetic skyrmion. The skyrmion follower may be either magnetically and electrically coupled to the free magnet to form a coupled system of switching magnetic layers. In an embodiment, the skyrmion follower has a weaker magnetic anisotropy than an anisotropy of the free magnet.

17 Claims, 12 Drawing Sheets

(51) Int. Cl.
  *H01L 43/10* (2006.01)
  *H01L 43/12* (2006.01)

(56) References Cited

U.S. PATENT DOCUMENTS

| | | | |
|---|---|---|---|
| 2013/0140513 | A1 | 6/2013 | Sheng-Chih et al. |
| 2016/0225817 | A1 | 8/2016 | Machkaoutsan et al. |
| 2016/0260892 | A1 | 9/2016 | Tahmasebi et al. |
| 2017/0033742 | A1 | 2/2017 | Akerman |
| 2017/0178747 | A1 | 6/2017 | Tokunaga et al. |
| 2017/0178748 | A1 | 6/2017 | Nagaosa et al. |
| 2018/0047894 | A1 | 2/2018 | Pinarbasi et al. |
| 2018/0301266 | A1 | 10/2018 | Ou et al. |
| 2019/0074044 | A1* | 3/2019 | Atulasimha ......... G11C 11/5607 |
| 2019/0131049 | A1 | 5/2019 | Buttner et al. |
| 2019/0206466 | A1 | 7/2019 | Schabes et al. |
| 2020/0006628 | A1 | 1/2020 | O'Brien et al. |
| 2020/0043536 | A1* | 2/2020 | Kuo ....................... H01L 43/10 |
| 2020/0357983 | A1 | 11/2020 | Zhao et al. |
| 2021/0013397 | A1 | 1/2021 | O'Brien et al. |

OTHER PUBLICATIONS

Dohi, Takaaki, et al., "Formation and current-induced motion of synthetic antiferromagnetic skyrmion bubbles", Nature Communications 10, 5153, 2019, 6 pgs.

Fert, Albert, et al., "Skyrmions on the track", Nature Nanotechnology, vol. 8, Mar. 2013, 5 pgs.

Iwasaki, Junichi, et al., "Universal current-velocity relation of skyrmion motion in chiral magnets", Nature Communications, DOI: 10,1038/ncomms2442, 2013, 8 pgs.

Jabeur, Kotb, et al., "High Performance Spin-Orbit-Torque (SOT) Based Non-volatile Standard Cell for Hybrid CMOS/Magnetic ICs", Computer Science and Information Technology, DOI: 10,13189/csit.2017.050301, 2017, 6 pgs.

Kang, Wang, et al., "Skyrmion-Electronics: An Overview and Outlook", Proceedings of the IEEE, vol. 104, No. 10, Oct. 2016, 22 pgs.

Legrand, William, et al., "Room-temperature stabilization of antiferromagnetic skyrmions in synthetic antiferromagnets", Nature Materials, vol. 19, Jan. 2020, 10 pgs.

Rosch, Achim, "Moving with the current", Nature Nanotechnology, vol. 8, Mar. 2013, 2 pgs.

Tomasello, R., et al., "Performance of synthetic antiferromagnetic racetrack memory: domain wall vs skyrmion", airXiv: 1610.00894v2 [cond-mat.mtri-sci], 2016, 21 pgs.

Zhang, Xichao, et al., "Magnetic bilayer-skyrmions without skyrmion Hall effect", Nature Communications, DOI; 10.1038/ncomms10293, Jan. 19, 2016, 7 pgs.

International Preliminary Report on Patentability from PCT/US2018/021737 dated Sep. 24, 2020, 12 pgs.

* cited by examiner

PERPENDICULAR SPIN TRANSFER TORQUE MEMORY (PSTTM) DEVICES WITH ENHANCED THERMAL STABILITY AND METHODS TO FORM THE SAME

CLAIM OF PRIORITY

This Application is a National Stage Entry of, and claims priority to, PCT Patent Application No. PCT/US2018/021737, filed on Mar. 9, 2018 and titled "PERPENDICULAR SPIN TRANSFER TORQUE MEMORY (PSTTM) DEVICES WITH ENHANCED THERMAL STABILITY AND METHODS TO FORM THE SAME", which is incorporated by reference in its entirety for all purposes.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased functionality. The drive for ever-more functionality, however, is not without issue.

It has become increasingly significant to rely heavily on innovative fabrication techniques to meet the exceedingly tight tolerance requirements imposed by scaling.

Non-volatile embedded memory with pSTTM devices, e.g., on-chip embedded memory with non-volatility can enable energy and computational efficiency. However, the technical challenges of assembling a pSTTM stack to form functional devices present formidable roadblocks to commercialization of this technology today. Specifically, increasing thermal stability, while reducing write error rates of pSTTM devices is one of the challenges in assembling a viable pSTTM stack.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements.

DESCRIPTION OF THE EMBODIMENTS

Figure 1A:
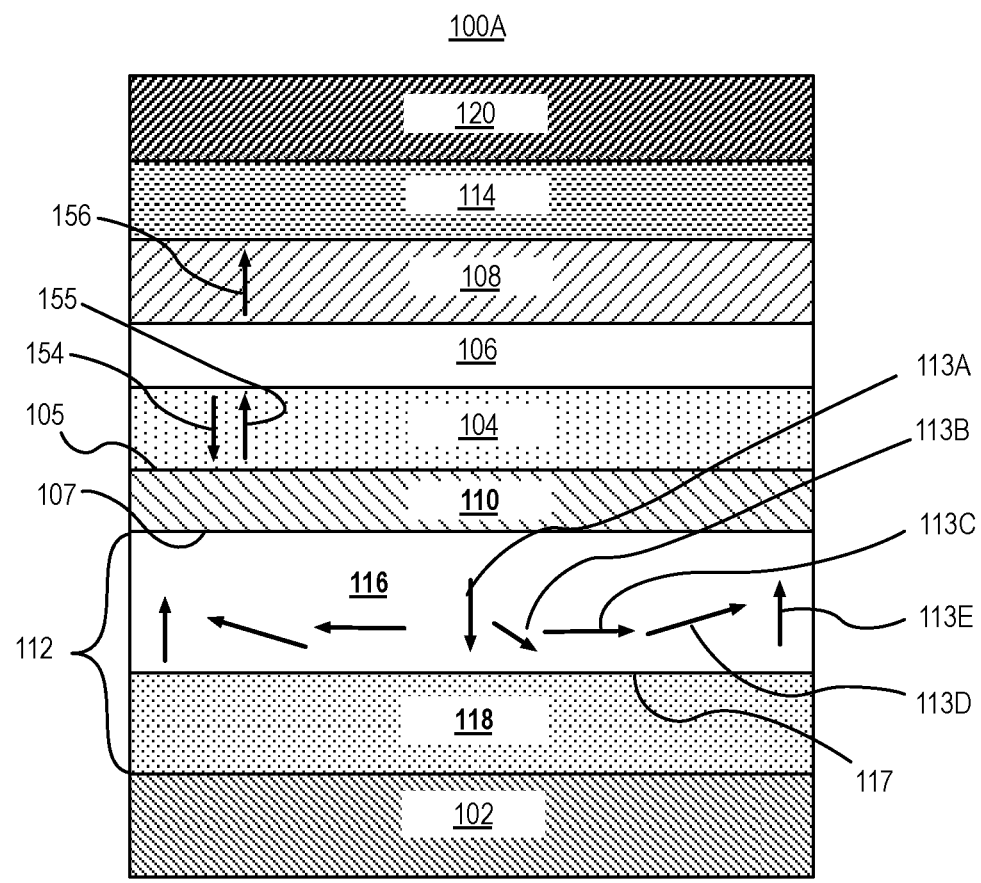
FIG. 1A illustrates a cross-sectional view of a material layer stack for a perpendicular STTM device, in accordance with an embodiment of the present disclosure.

Perpendicular-spin transfer torque memory (pSTTM) devices with enhanced stability and methods of fabrication are described. In the following description, numerous specific details are set forth, such as novel structural schemes and detailed fabrication methods in order to provide a thorough understanding of embodiments of the present disclosure. It will be apparent to one skilled in the art that embodiments of the present disclosure may be practiced without these specific details. In other instances, well-known features, such as pSTTM device operations and switching operations associated with embedded memory, are described in lesser detail in order to not unnecessarily obscure embodiments of the present disclosure. Furthermore, it is to be understood that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

In the following description, numerous details are set forth. However, it will be apparent to one skilled in the art, that the present disclosure may be practiced without these specific details. In some instances, well-known methods and devices are shown in block diagram form, rather than in detail, to avoid obscuring the present disclosure. Reference throughout this specification to "an embodiment" or "one embodiment" or "some embodiments" means that a particular feature, structure, function, or characteristic described in connection with the embodiment is included in at least one embodiment of the disclosure. Thus, the appearances of the phrase "in an embodiment" or "in one embodiment" or "some embodiments" in various places throughout this specification are not necessarily referring to the same embodiment of the disclosure. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

A pSTTM device functions as a variable resistor where the resistance of the device may switch between a high resistance state and a low resistance state. The resistance state of a pSTTM device is defined by the relative orientation of magnetization of two magnetic layers (fixed and free) that are separated by a tunnel barrier. When the magnetization of the two magnetic layers have orientations that are in the same direction the pSTTM device is said to be in a low resistance state. Conversely, when the magnetization of the two magnetic layers have orientations that are in opposite directions the pSTTM device is said to be in a high resistance state. In an embodiment, resistance switching is brought about by passing a critical amount of spin polarized current or switching current through the pSTTM device so as to influence the orientation of the magnetization of the free magnet to align with the magnetization of the fixed magnetic layer. By changing the direction of the current, the magnetization in the free magnet may be reversed relative to that of the fixed magnetic layer. Since the free magnet does not need power to retain relative orientation of magnetization, the resistance state of the pSTTM device is retained even when there is no power applied to the pSTTM device. For this reason, pSTTM belongs to a class of memory known as non-volatile memory.

Integrating a non-volatile memory device such as a STTM device onto an access transistor enables the formation of embedded memory for system on chip or for other applications. However, approaches to integrate an STTM device onto an access transistor presents challenges that have become far more formidable with scaling. Examples of such challenges range from improving thermal stability of STTM devices against perturbing forces, and reducing write error rates for a thermally stable STTM. As scaling continues, the need for smaller memory devices to fit into a scaled cell size has driven the industry in the direction of "perpendicular" STTM or pSTTM. Fortunately, while pSTTM devices have higher stability for small memory device sizes, maintaining stability along with improving other device parameters such as write error rate (WER) continues to be a challenge.

In some embodiments, a single free layer in a pSTTM device may be replaced by a multilayer stack including a plurality of magnetic and non-magnetic layers to advantageously increase thermal stability of the memory device. An increase in thermal stability may result from an increase in the total effective thickness (volume) of the switching magnetic layers of the pSTTM device. An increase in thermal stability also results from an increase in the overall interfacial perpendicular anisotropy of the magnetic and non-magnetic layers. In one embodiment, the multilayer stack includes a free magnet, a follower magnet having a weaker magnetic anisotropy than a magnetic isotropy of the free magnet, and a non-magnet between the free magnet and the follower magnet. While incorporating such a multilayer stack can increase the thermal stability, a solution for reducing write error rates in a pSTTM device may require incorporating a follower magnet having an ability to undergo magnetization switching faster and with lower energy than a free magnet. To undergo magnetization switching, the spins in the free magnet act under a torque of spin polarized tunneling electrons that pass through the tunnel barrier from the fixed magnet. In an embodiment, the spin orientation of the spin polarized tunneling electrons is opposite to the spin orientation of the electrons in the free magnet. For a torque to be imparted onto the electrons in the free magnet, the electrons in the free magnet need to have a spin orientation that is off axis from a spin orientation of the spin polarized tunneling electrons. Such an off-axis orientation in a small population of electrons in the free magnet arises due to random thermal motion. The process of exerting torque on a small population of electrons in the free magnet, causing these electrons to reverse their spin orientation is termed nucleation switching. The effect of nucleation switching subsequently propagates throughout the volume of the free magnet causing a magnetization switching in the free magnet. When a pSTTM device is operated at low voltages (less than 1.0V), nucleation events can dominate write times.

In some embodiments, the follower magnet may be replaced by a magnetic skyrmion follower, or a skyrmion follower as referred to herein, to reduce the time required to initiate nucleation switching. A skyrmion follower has a special property in that the magnetization across a volume of the skyrmion follower is not uniquely in plane or perpendicular. The total magnetic exchange coupling includes an antisymmetric exchange term arising from interaction between two neighboring spins in a skyrmion follower. The antisymmetric exchange results from a strong spin orbit coupling between the constituents of the skyrmion follower. The spin orbit coupling giving rise to the antisymmetric exchange interaction is known as the Dzyaloshinskii-Moriya interaction. The antisymmetric exchange coupling results in neighboring electron spins to be canted at some finite angle from each other. In one embodiment, a skyrmion follower has a structure that is known as Neel Skyrmion, where the electron spin orientation is perpendicular on axis, and gradually changes orientation along a radius from the axis to a periphery of the skyrmion follower. The spin orientation is perpendicular at the periphery but anti parallel to the perpendicular spin orientation at the axis. Such an arrangement provides a large collection of electrons with spins whose orientation is always non-parallel to spin polarized tunneling electrons emanating from the fixed magnetic layer. Thus, a skyrmion follower may reduce nucleation time as well as increase interfacial anisotropy for improving thermal stability.

An embodiment of a pSTTM device includes a first electrode and a second electrode, a free magnet between the first electrode and the second electrode, a fixed magnet between the first electrode and the second electrode, a tunnel barrier between the free magnet and the fixed magnet, a coupling layer between the free magnet and the first electrode, where the coupling layer comprise a metal and oxygen and a follower between the coupling layer and the first electrode, wherein the follower comprises a magnetic skyrmion. The skyrmion follower may be either magnetically and electrically coupled to the free magnet to form a coupled system of switching magnetic layers. In an embodiment, the skyrmion follower has a weaker magnetic anisotropy than an anisotropy of the free magnet. A magnet having a weaker magnetic field undergoes current induced magnetization switching more easily than a magnet with a stronger magnetic field. The presence of the skyrmion follower with a weaker magnetic field does not increase the switching current requirements of a pSTTM device. The switching current of a pSTTM device with a weaker magnetic follower layer is dictated by the magnetic strength of the stronger free magnet. The skyrmion follower also has a material composition and a thickness that enables it to retain magnetic properties. In an embodiment, the skyrmion follower has a magnetic field strength that is less than the magnetic field strength of the free magnet and also a current switching threshold that is less than a current switching threshold of the free magnet. The coupling layer between the free magnet and the skyrmion follower enables an increase in perpendicular anisotropy of the pSTTM material layer stack by providing increased interfacial anisotropy.

In some embodiments, the skyrmion follower includes a magnetic material in contact with a layer of non-magnetic material. In some such embodiments, an interfacial Dzyaloshinskii-Moriya interaction between the magnetic material and the non-magnetic material gives rise to a canted spin structure in the magnetic material. In other embodiments, the skyrmion follower includes an alloy of magnetic and non-magnetic materials which exhibits Dzyaloshinskii-Moriya interaction.

FIG. 1A illustrates a cross-sectional illustration of a pSTTM device 100A. The pSTTM device 100A includes an electrode 102 and an electrode 120, a free magnet 104 between the electrode 102 and the electrode 120, a fixed magnet 108 between the electrode 102 and the electrode 120. The pSTTM device 100A further includes a tunnel barrier 106 between the free magnet 104 and the fixed magnet 108. The pSTTM device 100A further includes a coupling layer 110 including a metal and oxygen between the free magnet 102 and the electrode 102 and a magnetic follower 112 between the coupling layer 110 and the electrode 102. The magnetic follower 112 comprises a magnetic skyrmion, herein referred to as skyrmion follower 112.

In the illustrative embodiment, the skyrmion follower 112 includes a layer 116 comprising a magnetic material and a layer 118 in contact with the layer 116, where the layer 118 includes a material with a strong spin-orbit coupling effect. A spin orbit interaction at an interface 117 between the magnetic material of the layer 116 and the non-magnetic material of the layer 118 results in a magnetic skyrmion in the layer 116.

Figure 1B:
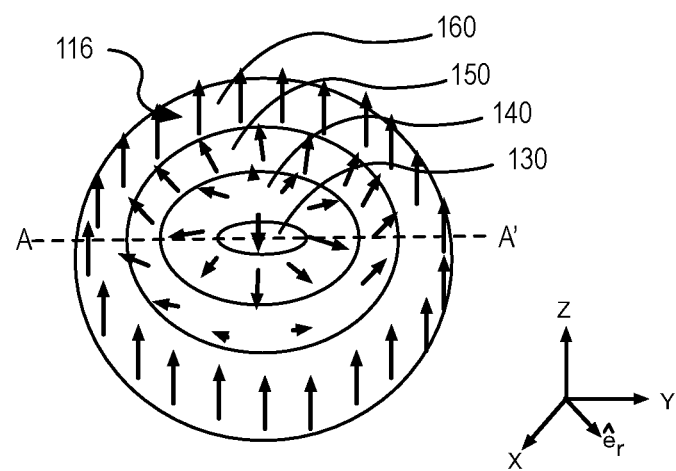
FIG. 1B illustrates an angled view of the first layer having a Neel skyrmion.

FIG. 1B illustrates an angled view of the layer 116 having a Neel skyrmion. In one such embodiment, the layer 116 of the skyrmion follower 112 has an average local magnetization depicted by the magnetization states that varies monotonically between perpendicular and in-plane over a cross section of the layer 116. In one example, an annular region 130 has a perpendicular magnetic anisotropy, and an annular region 140 having an in-plane magnetic anisotropy surrounds the annular region 130. As a further illustration, the layer 116 further includes an annular region 150 beyond the annular region 140 where the annular region 150 has a magnetic anisoptropy that is between in plane magnetic and perpendicular. In the illustrative embodiment, the annular region 130 surrounds a core that has perpendicular magnetic anisotropy that is antiparallel to a perpendicular magnetic anisotropy of an annular region 160 surrounding the annular region 150. While the skrymion follower 112 is described in terms of several regions, in reality, there is a continuum of magnetization states extending radially out from an axis of the layer 116.

Referring once again to FIG. 1A, the orientation of the various magnetization states 113A, 113B, 113C, 113D and 113E in the layer 116 are illustrated. The cross-sectional view is taken along a dashed line A-A' of FIG. 1B. In the illustrative embodiment, the magnetization state 113A and 113E are both perpendicular to an X-Y plane of the skyrmion follower 112, where the magnetization state 113A is anti-parallel to magnetization state 113E. Magnetization state 113B is parallel to the X-Y plane of the skyrmion follower 112.

Figure 1C:
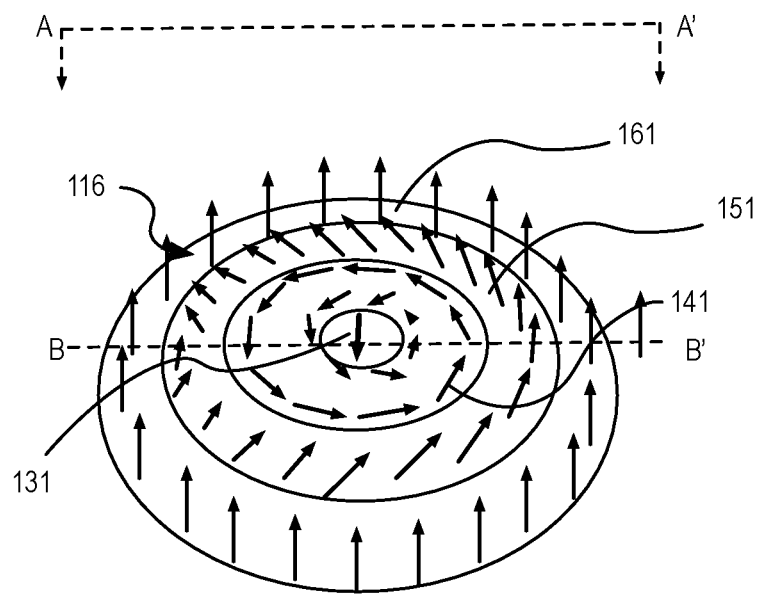
FIG. 1C illustrates an angled view of the first layer having a Bloch skyrmion.
Figure 1D:
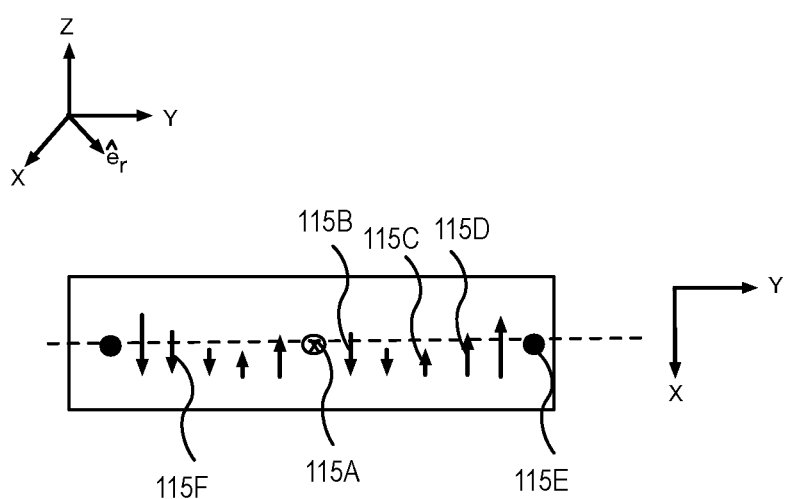
FIG. 1D illustrates a plan-view of a portion of the first layer along the dashed line A-A' of the structure in FIG. 1C.

FIG. 1C illustrates an angled view of the layer 116 having a Bloch skyrmion. In one such embodiment, the layer 116 of the skyrmion follower 112 has an average local magnetization depicted by the magnetization states that varies monotonically between perpendicular and in-plane over a cross section of the skrymion follower 112. In a Bloch skyrmion the magnetization states exhibit chiral phases or chirality, where the layer 116 lacks inversion symmetry such as the radial inversion symmetry present in the Neel skyrmion. In one example, an annular region 131 has a perpendicular magnetic anisotropy, and an annular region 141 having an in-plane magnetic anisotropy surrounds the annular region 131. As a further illustration, the layer 116 further includes an annular region 151 beyond the annular region 141 where the annular region 151 has a magnetic anisoptropy that is between in plane magnetic and perpendicular. In the illustrative embodiment, the annular region 130 surrounds a core that has perpendicular magnetic anisotropy that is antiparallel to a perpendicular magnetic anisotropy of an annular region 161 surrounding the annular region 151. While the skrymion follower 112 is described in terms of several regions, in reality, there is a continuum of magnetization states extending radially out from an axis of the layer 116. FIG. 1D illustrates a plan-view of a portion of the layer 116 along the dashed line A-A' of the structure in FIG. 1C. FIG. 1D illustrates orientation of the various magnetization states 115A, 115B, 115C, 115D and 115E in the layer 116. In the illustrative embodiment, the magnetization state 115A and 115E are both perpendicular to an X-Y plane of the skyrmion follower 112, where the magnetization state 115A is anti-parallel to magnetization state 115E. In an embodiment, magnetization states 115B, 115C, 115D are representative of magnetization states that exhibit chirality. In some such embodiments, magnetization states 115D and 115F are anti parallel due to chiral symmetry.

In some embodiments, the layer 116 includes cobalt, iron or an alloy of cobalt and iron. In some such embodiments, the layer 118 includes at least one of silicon, aluminum, platinum, iridium, tungsten, bismuth, gold, osmium, rhenium or lead. Exemplary examples of skyrmion follower 112 includes a bilayer of $Co_xFe_{1-x}$/Si, $Co_xFe_{1-x}$/Al, $Co_xFe_{1-x}$/Bi, $Co_xFe_{1-x}$/Pt and $Co_xFe_{1-x}$/Ir. In some embodiments, the layer 116 includes iron and the layer comprises at least one of iridium, aluminum, silicon or nickel. Depending on materials selected the layer 116 has a thickness between 2 nm-4 nm and the layer 118 has a thickness between 1 nm-2 nm. In exemplary embodiments, the skrymion follower 112 has a thickness that is less than or equal to 4 nm.

Figure 1E:
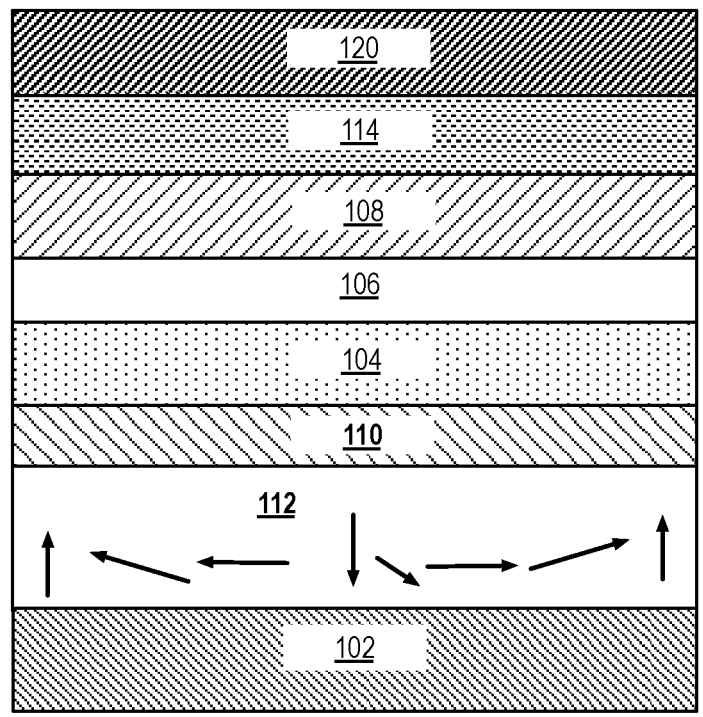
FIG. 1E illustrates a cross-sectional view of a perpendicular STTM device having a skrymion follower including a magnetic alloy, in accordance with an embodiment of the present disclosure.

In some embodiments, the skyrmion follower 112 comprises a magnetic alloy as is illustrated in the pSTTM device 100B of FIG. 1E. Depending on embodiments, the magnetic alloy includes iron and at least one of iridium, aluminum, silicon or nickel, an alloy comprising cobalt and iron, or an alloy comprising cobalt and nickel. The thickness of the magnetic alloy may range between 1 nm-4 nm.

Referring again to FIG. 1A, the coupling layer 110 provides a source of oxygen that enables oxygen-iron hybridization at an interface 105 located between a lowermost surface of the free magnet 104 and an uppermost surface of the coupling layer 110 and may include a material including magnesium and oxygen. The coupling layer 110 enables an increase in interfacial perpendicular anisotropy of the pSTTM device 100A. An interface 107 between the skyrmion follower 112 and the coupling layer 110 further increases the interfacial perpendicular anisotropy of the pSTTM device 100A. In an exemplary embodiment, the coupling layer 110 is approximately 10-1000 times more conductive than the tunnel barrier 106.

The skyrmion follower 112 is ferromagnetically coupled to the free magnet 104. In some embodiments, the skyrmion follower 112 has a magnetic anisotropy that is less than a magnetic anisotropy of the free magnet 104. Having a lower magnetic anisotropy may allow the skyrmion follower 112 to have a current switching threshold that is less than a current switching threshold of the free magnet 104.

In an exemplary embodiment, the fixed magnet 108 and the free magnet 104 have perpendicular magnetic anisotropy. The pSTTM device 100A is in a high resistance state when a magnetization 154 of the free magnet 104 is oppositely (anti-parallel) directed to a magnetization 156 of the fixed magnet 108. Conversely, the pSTTM device 100A is in a low resistance state when a magnetization 155 in the free magnet 104 is parallel to the direction of magnetization in the fixed magnet 108. A change in resistance (high to low or low to high) in the pSTTM device 100A results when a spin polarized electron current passing from the fixed magnet 108 through the tunnel barrier 106 brings about a change in the direction of the magnetization in the free magnet 104.

In an embodiment, fixed magnet 108 includes a material and has a thickness sufficient for maintaining a fixed magnetization. For example, fixed magnet 108 may include an alloy such as CoFe and CoFeB. In an embodiment, fixed magnet 108 includes $Co_{100-x-y}Fe_xB_y$, where X and Y each represent atomic percent such that X is in the range of 50-80 and Y is in the range of 10-40, and the sum of X and Y is less than 100. In an embodiment, X is 60 and Y is 20. In an embodiment, fixed magnet 108 is FeB, where the concentration of boron is between 10-40 atomic percent of the total composition of the FeB alloy. In an embodiment, the fixed magnet 108 has a thickness that is in the range of 1 nm-2.5 nm.

In an embodiment, tunnel barrier 106 is composed of a material suitable for allowing electron current having a majority spin to pass through tunnel barrier 106, while impeding, at least to some extent, electron current having a minority spin from passing through tunnel barrier 106. Thus, tunnel barrier 106 (or spin filter layer) may also be referred to as a tunneling layer for electron current of a particular spin orientation. In an embodiment, tunnel barrier 106 includes a material such as, but not limited to, magnesium oxide (MgO) or aluminum oxide ($Al_2O_3$). In an embodiment, tunnel barrier 106 including an MgO material has a crystal orientation that is (001) and is lattice matched to free magnet 104 below the tunnel barrier 106 and lattice matched to the fixed magnet 108 above tunnel barrier 106. In one example, the tunnel barrier 106 is MgO and has a thickness in the range of 1 nm to 2 nm. In an embodiment, the tunnel barrier 106 has a material and thickness that at least 1000 times less conductive than the coupling layer 110.

In an embodiment, free magnet 104 includes a magnetic material such as Co, Ni, Fe or alloys of these materials. In an embodiment, free magnet 104 includes a magnetic material such as FeB, CoFe and CoFeB. In an embodiment, free magnet 104 includes a $Co_{100-x-y}Fe_xB_y$, where X and Y each represent atomic percent such that X is between 50-80 and Y is between 10-40, and the sum of X and Y is less than 100. In an embodiment, X is 60 and Y is 20. In an embodiment, free magnet 104 is FeB, where the concentration of boron is between 10-40 atomic percent of the total composition of the FeB alloy. In an embodiment, free magnet 104 has a thickness that is in the range of 1 nm-2.5 nm.

In an embodiment, electrode 102 includes an amorphous conductive layer. In an embodiment, electrode 102 is a topographically smooth electrode. In an embodiment, electrode 102 includes a material such as W, Ta, TaN or TiN. In an embodiment, electrode 102 is composed of Ru layers interleaved with Ta layers. In an embodiment, electrode 102 has a thickness in the range of 20 nm-50 nm. In an embodiment, electrode 120 includes a material such as W, Ta, TaN or TiN. In an embodiment, electrode 120 has a thickness in the range of 70-70 nm. In an embodiment, electrode 102 and electrode 120 are the same metal such as Ta or TiN.

In the illustrative embodiment, the pSTTM device 100A further includes a synthetic antiferromagnetic (SAF) structure 114 between the electrode 120 and the fixed magnet 108. In an embodiment, when the free magnet 104 and the fixed magnet 108 have similar thicknesses, an injected electron spin current which changes the orientation of the magnetization in the free magnet 104 can also affect the magnetization of the fixed magnet 108. In an embodiment, to prevent accidental flipping of the direction of magnetization 156 in the fixed magnet 108, a synthetic antiferromagnetic (SAF) structure 114 is disposed between the electrode 104 and the fixed magnet 108. In some embodiments, where the fixed magnet 108 includes a CoFeB layer having a thickness that is less than 1.5 nm, a synthetic antiferromagnetic (SAF) structure 114 between the electrode 120 and the fixed magnet 108 prevents accidental flipping of the fixed magnet 108. The SAF structure 114 is ferromagnetically coupled with the fixed magnet 108 and pins the direction of the magnetization 156 in the fixed magnet 108.

Figure 1F:
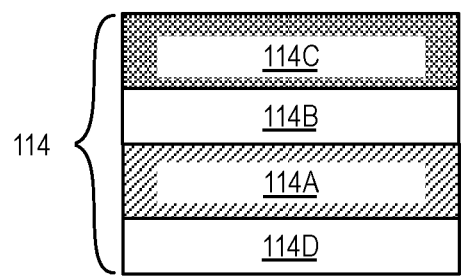
FIG. 1F illustrates cross-sectional view of the synthetic antiferromagnetic (SAF) structure.

FIG. 1F illustrates cross-sectional view of the synthetic antiferromagnetic (SAF) structure 114. In an embodiment, the SAF structure 114 includes a non-magnetic layer 114B between a first ferromagnetic layer 114A and a second ferromagnetic layer 114C as depicted in FIG. 1F. The first ferromagnetic layer 114A and the second ferromagnetic layer 114C are anti-ferromagnetically coupled to each other. In an embodiment, the first ferromagnetic layer 114A includes a layer of a magnetic metal such as Co, Ni, Fe, alloys such as CoFe, CoFeB, or alloys of magnetic metals such as Co, Ni, Fe or a bilayer of a magnetic/non-magnetic metals such but not limited to Co/Pd or a Co/Pt. In an embodiment, the non-magnetic layer 114B includes a ruthenium or an iridium layer. In an embodiment, the second ferromagnetic layer 114C includes a layer of a magnetic metal such as Co, Ni, Fe, alloys such as CoFe, CoFeB, or alloys of magnetic metals such as Co, Ni, Fe or a bilayer of a magnetic/non-magnetic metals such but not limited to Co/Pd or a Co/Pt. In an embodiment, a ruthenium based non-magnetic layer 114B is limited to a thickness between 4-9 Angstroms to ensure that the coupling between the first ferromagnetic layer 114A and the second ferromagnetic layer 114C is anti-ferromagnetic in nature. The SAF structure 114 may further include an additional non-magnetic spacer layer 114D below the magnetic layer 114A and the fixed magnet 108 to avoid direct coupling or increasing the volume of the fixed magnet 108. In an embodiment, a non-magnetic spacer layer 114D may include metals such as Ta, Ru or Ir.

Figure 2A:
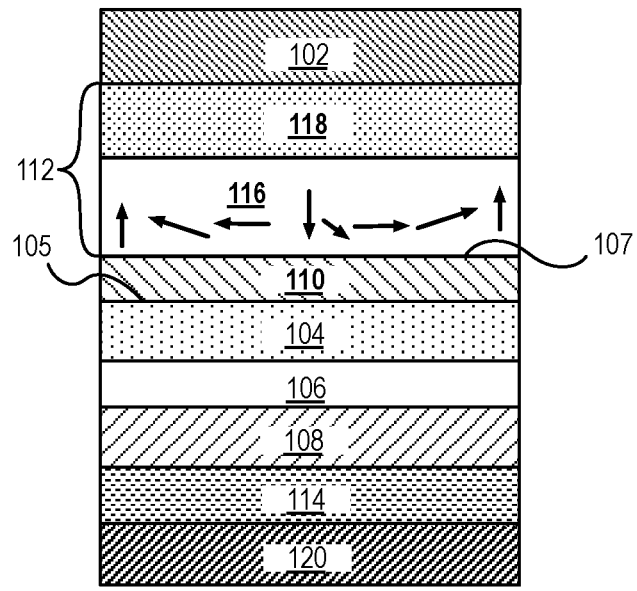
FIG. 2A illustrates cross-sectional view of a pSTTM device having an orientation where the skrymion follower is above the free magnet.

FIG. 2A illustrates cross-sectional view of a pSTTM device 200A including a skrymion follower 112 above the free magnet 104 where the layer 118 is above the layer 116 comprising the magnetic material.

Figure 2B:
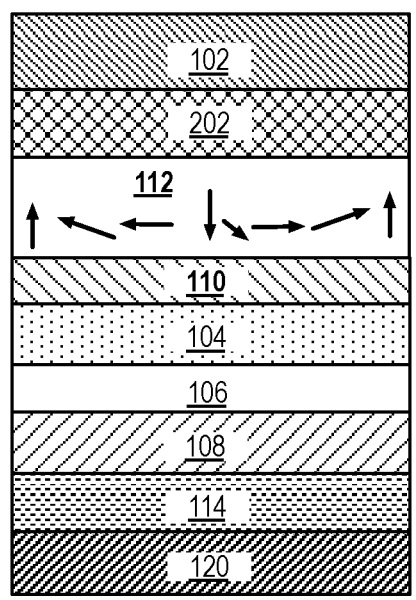
FIG. 2B illustrates cross-sectional view of a pSTTM device having an orientation where the skrymion follower, including a magnetic alloy, is above the free magnet.

FIG. 2B illustrates cross-sectional view of a pSTTM device 200B having an orientation where the skrymion follower 112, including a magnetic alloy, is above the free magnet 104 and a capping layer 202 above the skrymion follower 112. The capping layer 202 may include metal with a lack of oxygen affinity such as molybdenum and ruthenium and may provide protection against oxygen scavenging from the interfaces 105 and 107. Protection against oxygen scavenging from interfaces 105 and 107 helps to maintain interfacial perpendicular anisotropy in the skrymion follower 112.

Figure 3A:
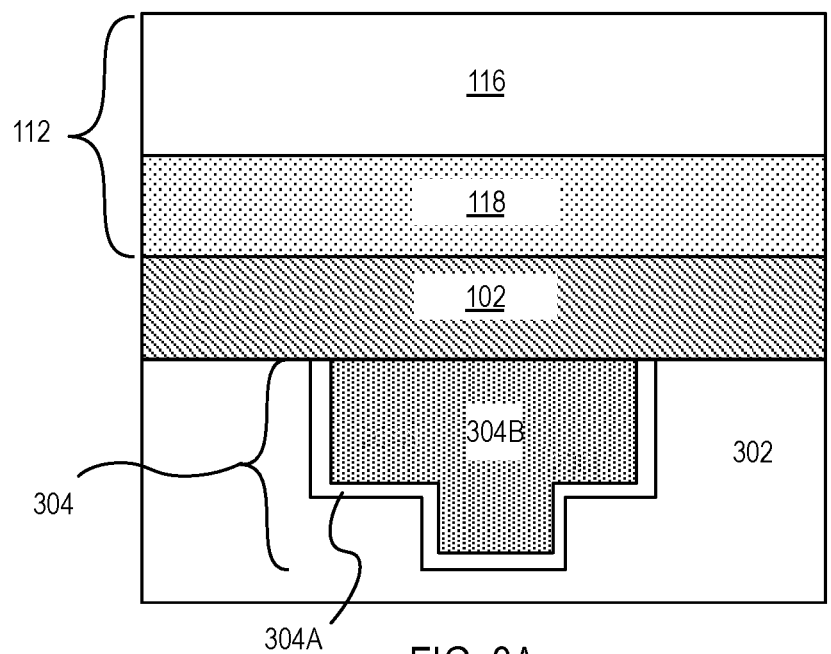
FIG. 3A illustrates a cross-sectional view following the formation of a first electrode on a conductive interconnect, and following the formation of a skrymion follower on the first electrode.

FIGS. 3A-3F illustrate cross-sectional views representing various operations in a method of fabricating a pSTTM device, in accordance with an embodiment of the present disclosure. FIG. 3A illustrates a conductive interconnect 304 surrounded by a dielectric layer 302 formed above a substrate, an electrode layer 305 formed on the conductive interconnect 304 surrounded by a dielectric layer 302, a non-magnetic layer 307 formed on the electrode layer 305 and a magnetic layer 309 formed on the non-magnetic layer 307. In the illustrative embodiment, the magnetic layer 309 formed on the non-magnetic layer 307 is collectively a skrymion follower layer 311. In an embodiment, the conductive interconnect 304 is formed in a dielectric layer 302 by a damascene or a dual damascene process that is well known in the art. In an embodiment, the conductive interconnect 304 includes a barrier layer 304A, such as tantalum nitride, and a fill metal 304B, such as copper, tungsten or ruthenium. In an embodiment, the conductive interconnect 304 is fabricated using a subtractive etch process when materials other than copper are utilized. In an embodiment, the dielectric layer 302 includes a material such as but not limited to silicon dioxide, silicon nitride, silicon carbide, or carbon doped silicon oxide. The dielectric layer 302 may have an uppermost surface that is substantially co-planar with an uppermost surface of the conductive interconnect 304, as illustrated. In some examples, the dielectric layer 302 has a total thickness between 70 nm-300 nm. In some embodiments, conductive interconnect 304 is electrically connected to a circuit element such as a transistor (not shown). In an embodiment, the electrode layer 305 is deposited using a physical vapor deposition process or a plasma enhanced chemical vapor deposition process. The electrode layer 305 may be first blanket deposited and subsequently planarized to form a topographically smooth uppermost surface having a surface roughness that is less than 2 nm.

In some embodiments, each of the non-magnetic layer 307 and the magnetic layer 309 of the skrymion follower layer 311 may be blanket deposited by a physical vapor deposition (PVD) process. In an embodiment, the PVD process is an RF or a DC sputtering process. In some such embodiments, the non-magnetic layer 307 includes at least one of silicon, aluminum, platinum, iridium, tungsten, bismuth, gold, osmium, rhenium or lead. In some embodiments, the magnetic layer 309 includes cobalt, iron or cobalt and iron. Exemplary examples of skrymion follower layer 311 include a bilayer of $Co_xFe_{1-x}$ and Si, bilayer of $Co_xFe_{1-x}$ and Al, bilayer of $Co_xFe_{1-x}$ and Bi, bilayer of $Co_xFe_{1-x}$ and Pt and bilayer of $Co_xFe_{1-x}$ and Ir. In some embodiments, the magnetic layer 309 includes iron and the second layer comprises at least one of iridium, aluminum, silicon or nickel. Depending on materials selected the magnetic layer 309 has a thickness between 2 nm-4 nm and the non-magnetic layer 307 has a thickness between 1 nm-2 nm. In exemplary embodiments, the skrymion follower layer 311 has a thickness that is less than or equal to 4 nm.

Figure 3B:
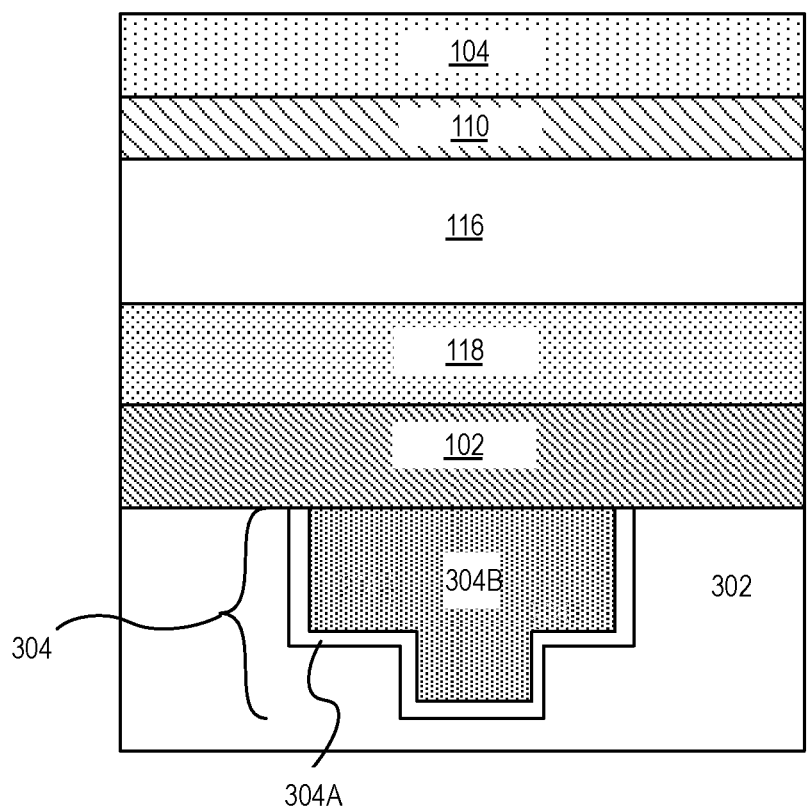
FIG. 3B illustrates a cross-sectional view of the structure in FIG. 3A following the formation of a coupling layer on the skrymion follower and the formation of a free magnet on the coupling layer.
Figure 3C:
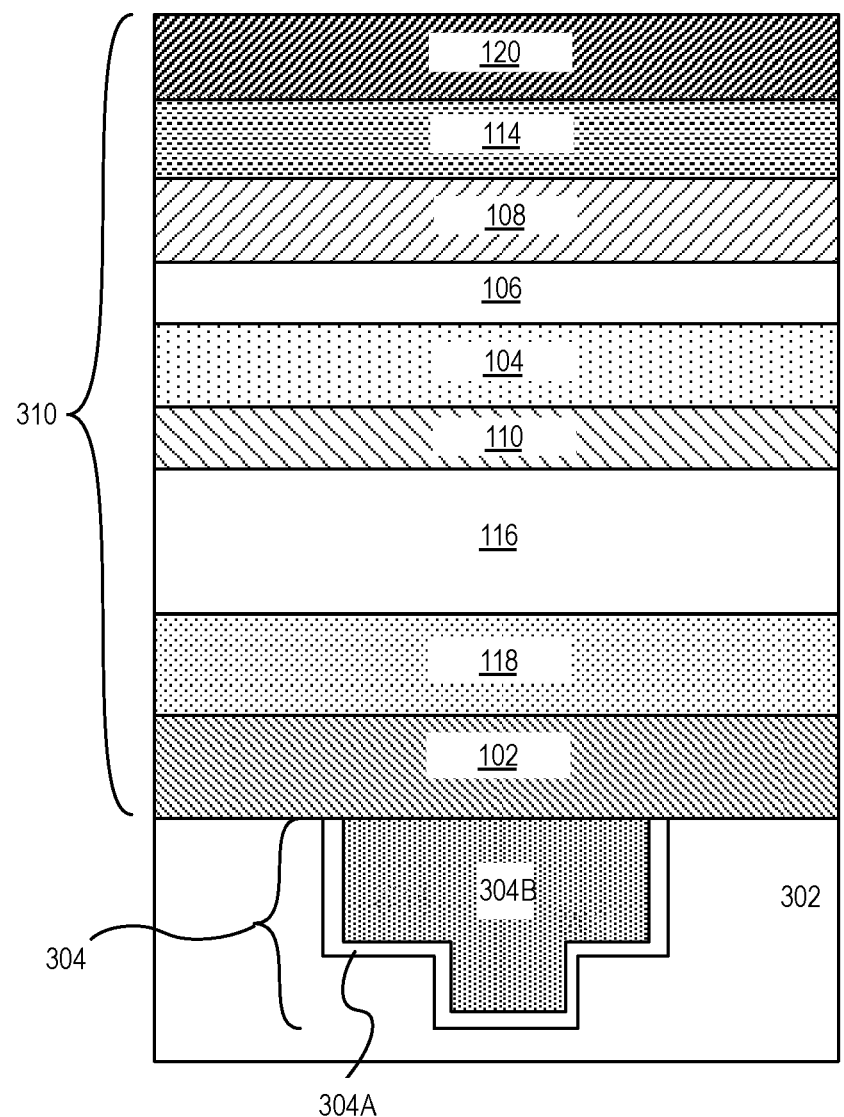
FIG. 3C illustrates a cross-sectional view of the structure in FIG. 3B following the formation of various layers of a material layer stack for a pSTTM device including a synthetic anti-ferromagnetic layer.

In some embodiments, the skrymion follower layer 311 comprises a magnetic alloy as discussed above. A magnetic alloy may be formed by depositing iron and at least one of iridium, aluminum, silicon or nickel, an alloy comprising cobalt and iron, or an alloy comprising cobalt and nickel. The magnetic alloy may be deposited by a physical vapor deposition (PVD) process. In an embodiment, the PVD process is an RF or a DC sputtering process. The magnetic alloy may be deposited to a thickness in the range between 3 nm-6 nm. FIG. 3B illustrates a cross-sectional view of the structure in FIG. 3A following the formation of a coupling layer 313 on the magnetic layer 309 and the formation of a free magnetic layer 315 on the coupling layer 313. In an embodiment, the coupling layer 313 is deposited using a reactive sputter deposition technique and includes magnesium and oxygen. In some embodiments, the coupling layer 313 is deposited to a thickness between 0.3 nm-1.5 nm. In some embodiments, the coupling layer 313 includes an amorphous MgO. The amorphous MgO may have a lower dielectric strength compared to a dielectric strength of the tunnel barrier 317. In an embodiment, the free magnetic layer 315 is blanket deposited using a PVD process. In an embodiment, the deposition process is carried out at room temperature. In an embodiment, the free magnetic layer 315 includes Co or an alloy of Co such as but not limited to CoB, CoFe or CoFeB and an alloy of iron such as FeB. In an embodiment, the free magnetic layer 315 is formed by a co-sputter deposition process in a PVD chamber. FIG. 3C illustrates a cross-sectional view of the structure in FIG. 3B following the formation of the remaining layers of a material layer stack 325 to form a pSTTM device on the free magnetic layer 315. In an embodiment, the electrode layer 305, the nonmagnetic layer 307, the magnetic layer 309, the coupling layer 313, the free magnetic layer 315, and the remaining layers of the material layer stack 325 are sequentially blanket deposited without breaking vacuum in a PVD process toolset. In an embodiment, a tunnel barrier layer 317 is blanket deposited on the free magnetic layer 315. In an embodiment, the tunnel barrier layer 317 includes a material such as MgO or $Al_2O_3$. In an embodiment, the tunnel barrier layer 317 is a layer of crystalline MgO and is deposited using a reactive sputter process. In an embodiment, the reactive sputter process is carried out at room temperature. In an embodiment, reactive sputter process is carried out at elevated temperatures between 200-400 C. In an embodiment, tunnel barrier layer 317 is a layer of MgO and is RF sputtered from a MgO target. In an embodiment, tunnel barrier layer 317 includes magnesium and oxygen and is formed by a reactive oxidation of a DC sputtered magnesium film. A fixed magnetic layer 319 is then blanket deposited onto the tunnel barrier layer 317. The deposition process to form a fixed magnetic layer 319 is substantially the same as the process utilized to the form the free magnetic layer 315. A SAF structure 321, that is substantially the same as the SAF structure 114 including the various layers described in association with FIG. 1F, is then formed on the fixed magnetic layer 319. In an embodiment, a non-magnetic material such as Ta, Ru or Ir is deposited on the fixed magnetic layer 319, followed by the formation of an alternating stack of magnetic, non-magnetic and magnetic materials to form a ferromagnet. In some embodiments, deposition of the non-magnetic material including Ta or Ir on the fixed magnetic layer 319 may cause magnetic degradation of monolayers of an uppermost portion of the fixed magnetic layer 319. In some such embodiments, the presence of the SAF structure 321 advantageously provides magnetic coupling to the fixed magnetic layer 319 to maintain a chosen magnetization direction throughout the magnetic switching process described above.

The process for forming the material layer stack 325 further includes capping the SAF structure 321 with an electrode layer 323. In one or more embodiments, the electrode layer 323 includes a material that is the same or substantially the same as the material of the electrode layer 305. In some embodiments, formation of the electrode layer 323 includes depositing a layer of Ta to function as a hardmask during subsequent patterning of the material layer stack 325. Deposition of a layer of Ta can be carried out in using a deposition process that preserves the magnetic anisotropy of an uppermost magnetic layer of the SAF structure 321. The thickness of the electrode layer 323 is chosen so that a sufficient amount of electrode layer 323 remains on the SAF structure 321 after patterning of the material layer stack 325 to form a pSTTM device.

In an embodiment, after all the layers in the material layer stack 325 are deposited, an anneal is performed under conditions well known in the art to promote solid phase epitaxy of the free magnetic layer 315 following a template of a crystalline layer of the tunnel barrier layer 317. A post-deposition anneal of the material layer stack 325 is carried out in a furnace at a temperature between 300-400 degrees C. In an embodiment, the anneal is performed immediately post deposition but before patterning of the material layer stack 325 to enable a crystalline MgO to be formed in the tunnel barrier layer 317.

In an embodiment, the annealing process is also performed in the presence of a magnetic field which sets the magnetization direction of the fixed magnetic layer 319 and the free magnetic layer 315, and in the magnetic layer 309 of the skrymion follower layer 311. An applied magnetic field that is directed parallel to a vertical axis of the material layer stack 325, during the annealing process, enables a perpendicular anisotropy to be set in the fixed magnetic layer 319, in the free magnetic layer 315, in the magnetic layer 309 of the skyrmion follower layer 311. The annealing process initially aligns magnetization of the fixed magnetic layer 319, magnetization of the free magnetic layer 315, and magnetization of the skyrmion follower 112 parallel to each other.

Figure 3D:
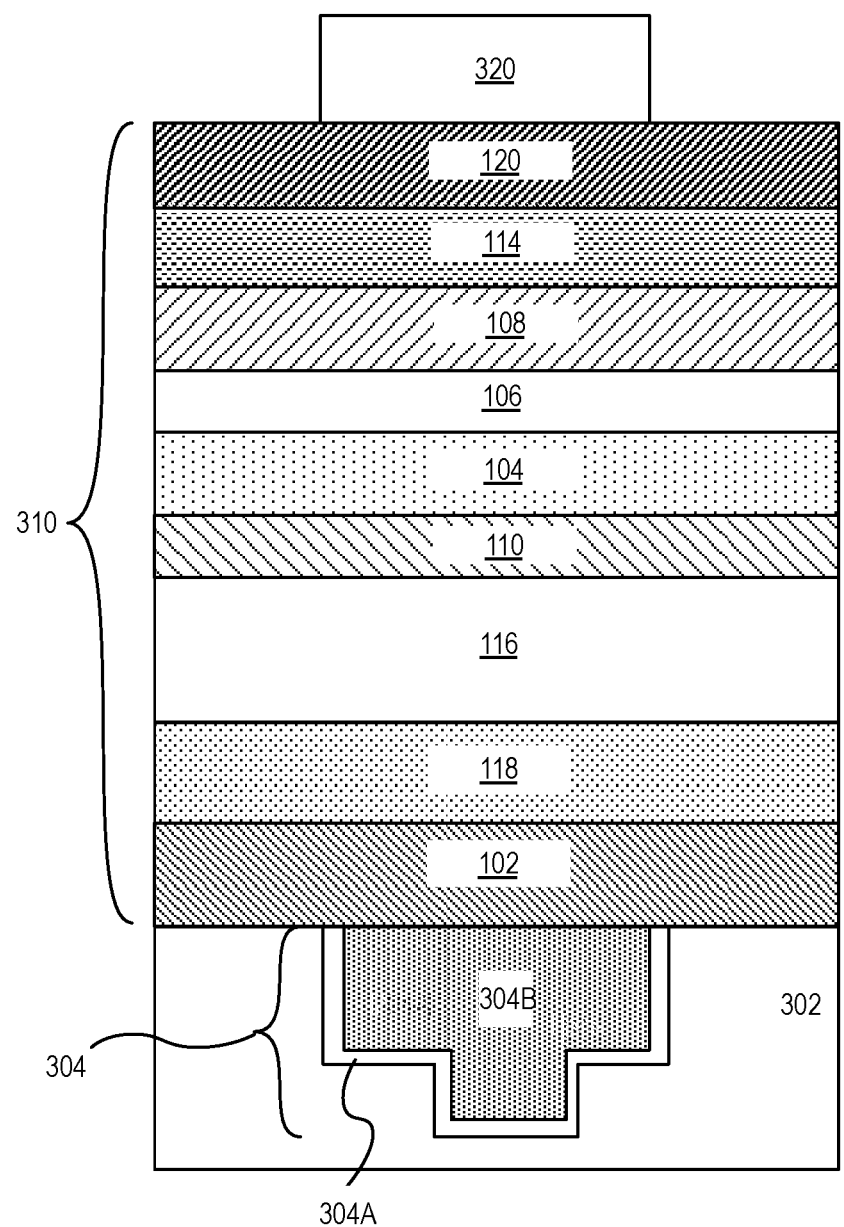
FIG. 3D illustrates a cross-sectional view of the structure in FIG. 3C following the formation of a mask on the material layer stack for the pSTTM device.

FIG. 3D illustrates the structure of FIG. 3C following the formation of a mask 326 on the material layer stack 325. In an embodiment, the mask includes a layer of resist. In some embodiments, the mask 326 includes a dielectric material that is etched after forming a layer of resist that is formed and lithographically patterned, on the dielectric material. Depending on embodiments, the width of the mask 326 ranges between 10 nm-30 nm.

Figure 3E:
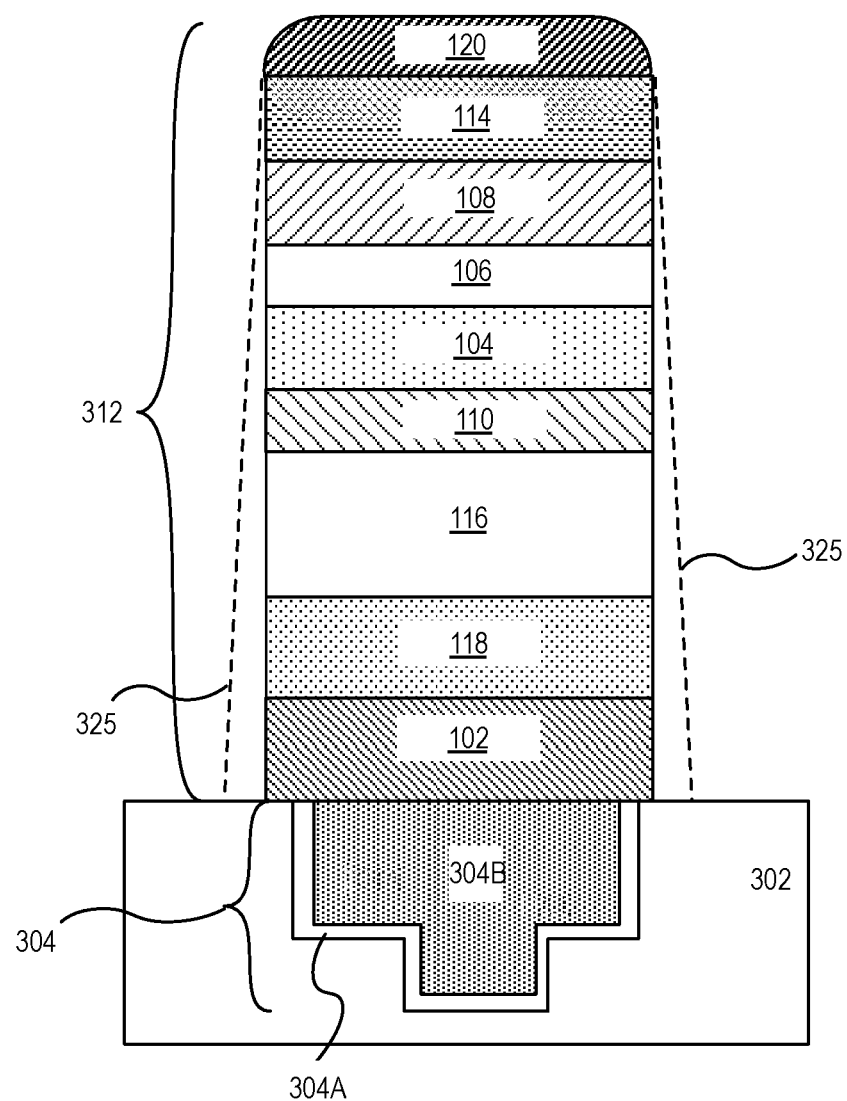
FIG. 3E illustrates a cross-sectional view of the structure in FIG. 3D following the process of patterning and etching to form a pSTTM device.

FIG. 3E illustrates the structure of FIG. 3D following the patterning of the material layer stack 325 to form a pSTTM device 330. In one embodiment, the material layer stack 325 is etched by a plasma etch process. In one example, the plasma etch process etches the entire material layer stack 325 and forms the pSTTM device 330 and exposes the underlying dielectric layer 302. In the illustrative embodiment, the plasma etch process etches the electrode layer 323 to form an electrode 120, etches the SAF structure 321 to form a SAF structure 114, etches the fixed magnetic layer 319 to form fixed magnet 108, etches the tunnel barrier layer 317 to form tunnel barrier 106, etches the free magnetic layer 315 to form free magnet 104, etches the coupling layer 313 to form coupling layer 110, etches the magnetic layer 309 to form magnetic material 116, etches the non-magnetic layer 307 to form non-magnetic material 118, and etches the electrode layer 305 to form electrode 102. In one embodiment, the magnetic material 116 formed on the non-magnetic material 118 constitutes a skyrmion follower 112. In an embodiment, the plasma etch process consumes all of the mask 326 and between 50-80% of the top electrode layer 323. Depending on the plasma etch parameters, in some embodiments, the pSTTM device 330 has a sidewall angle that is tapered (indicated by dashed lines 327).

Figure 3F:
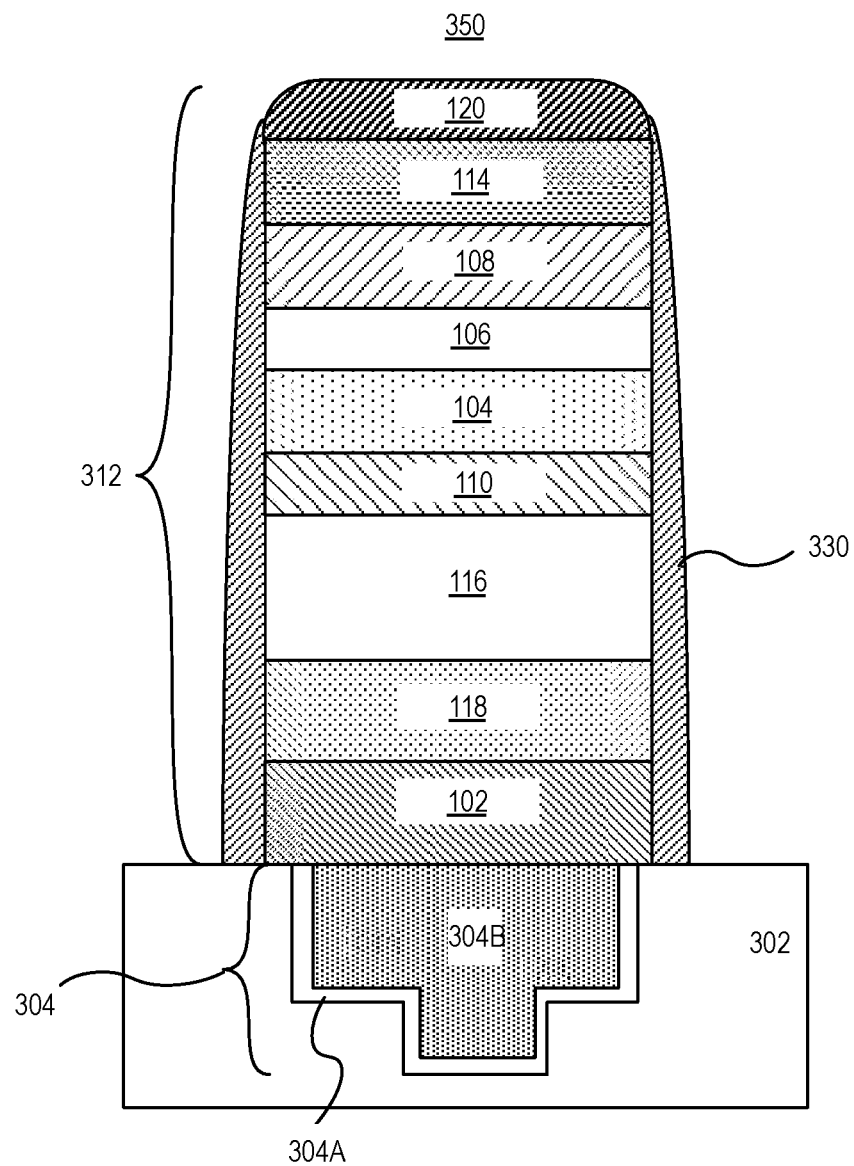
FIG. 3F illustrates a cross-sectional view of the structure in FIG. 3D following the process of depositing a dielectric spacer layer and patterning the dielectric spacer layer to form a dielectric spacer adjacent to sidewall of the pSTTM device.

FIG. 3F illustrates the structure of FIG. 3E following the formation of a dielectric spacer 332 on sidewalls of the pSTTM device 330. In an embodiment, a dielectric spacer layer is blanket deposited on the pSTTM device 330 and on an uppermost surface of the dielectric layer 302. In an embodiment, the dielectric spacer layer is deposited without a break following the plasma etch process utilized to pattern the material layer stack 325. In an embodiment, the dielectric spacer layer includes a material such as silicon nitride or carbon doped silicon nitride and does not contain a material that includes oxygen. In the illustrative embodiment, the dielectric spacer layer is patterned to form a dielectric spacer 332. In some such embodiments, after patterning the dielectric spacer 332 remains adjacent to sidewalls of the pSTTM device 330 as is illustrated in FIG. 3F.

In an embodiment, a second anneal process can be performed after formation of the pSTTM device 330 and deposition of the dielectric spacer layer, but prior to patterned the dielectric spacer layer. In an embodiment, the second anneal process is carried out at a process temperature of at least 300 degrees Celsius but less than 500 degrees Celsius. A high temperature anneal process post patterning and post spacer deposition may help to recrystallize sidewalls of the tunnel barrier 106 that may have become potentially damaged during the etching process utilized to form the pSTTM device 330.

Figure 4:
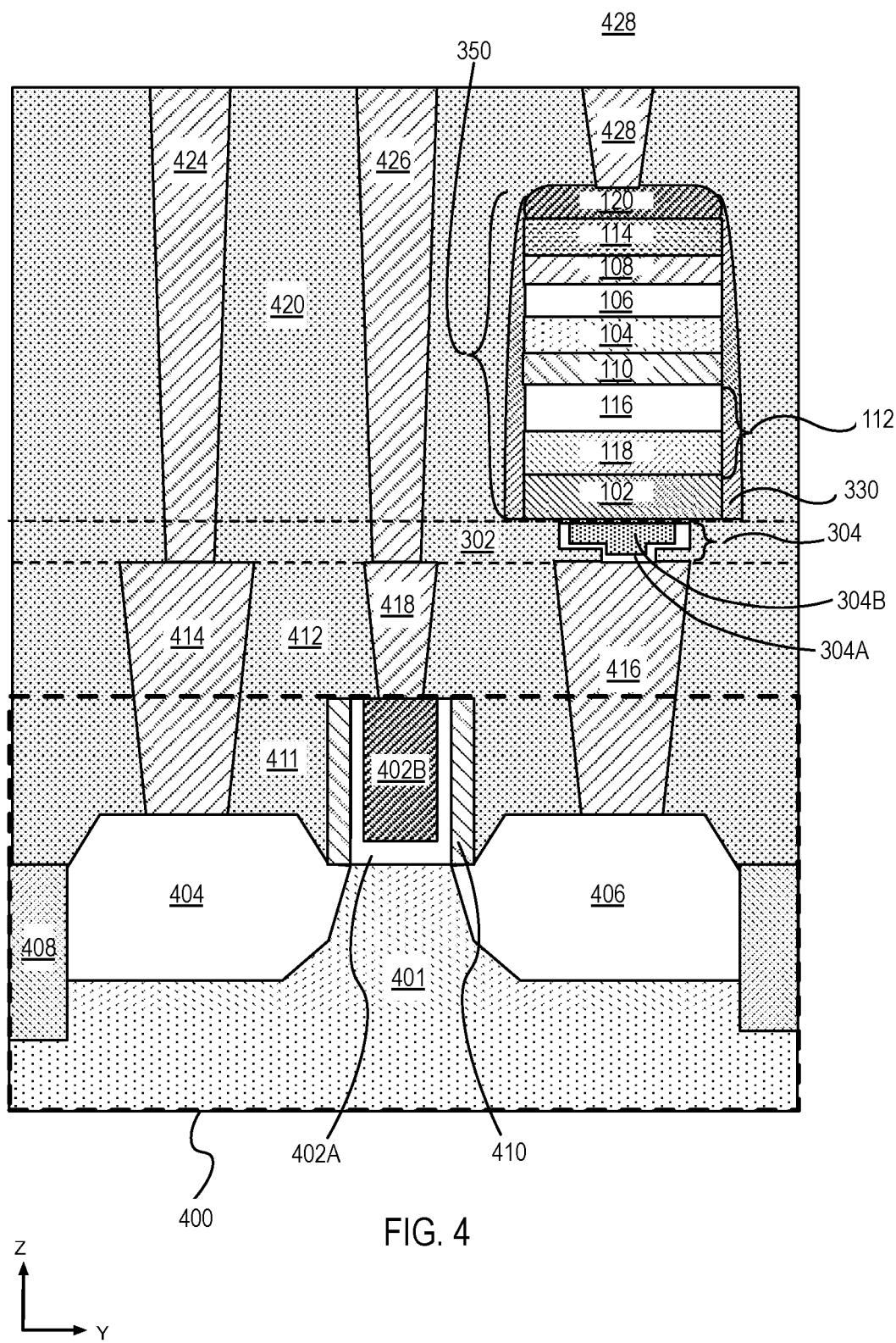
FIG. 4 illustrates a cross-sectional view of a pSTTM device on a conductive interconnect coupled to a transistor.

FIG. 4 illustrates a pSTTM device coupled to an access transistor 400. In an embodiment, the pSTTM device includes a pSTTM device 330 described in association with FIG. 3F. In the illustrative embodiment, the pSTTM device 330 is coupled to the transistor through a conductive interconnect 304 and a drain contact 416. The drain contact is coupled with the drain region 406 of the access transistor 400. The pSTTM device 330 includes an electrode 102 and an electrode 120, a free magnet 104 between the electrode 102 and the electrode 120, a fixed magnet 108 between the electrode 102 and the electrode 120, a tunnel barrier 106 between the free magnet 104 and the fixed magnet 108, a coupling layer 110 between the free magnet 104 and the electrode 102, where the coupling layer 110 includes a metal and oxygen and a skyrmion follower 112 between the coupling layer 110 and the electrode 102. In an exemplary embodiment, the pSTTM device 330 is surrounded by a dielectric spacer layer 330 as illustrated in FIG. 4. In the illustrative embodiment, a memory contact 428 is coupled to the pSTTM device 330. In an embodiment, the pSTTM device 330 has a width (along Y direction) that is greater than the width (along Y direction) of the conductive interconnect 304. In one such embodiment, a portion of the electrode 104 of pSTTM device 330 is also on a dielectric layer 302. The pSTTM device 330 may have a width smaller than the width of the conductive interconnect 304. In other examples, the pSTTM device 330 has a width equal to the width of the conductive interconnect 304.

In an embodiment, the underlying substrate 401 represents a surface used to manufacture integrated circuits. Suitable substrate 401 includes a material such as single crystal silicon, polycrystalline silicon and silicon on insulator (SOI), as well as substrates formed of other semiconductor materials. The substrate 401 may also include semiconductor materials, metals, dielectrics, dopants, and other materials commonly found in semiconductor substrates.

In an embodiment, the access transistor 400 associated with substrate 401 are metal-oxide-semiconductor field-effect transistors (MOSFET or simply MOS transistors), fabricated on the substrate 401. In various implementations of the invention, the access transistor 400 may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors.

In an embodiment, the access transistor 400 of substrate 401 includes a gate stack including at least two layers, a gate dielectric layer 402A and a gate electrode 402B. The gate dielectric layer 402A may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer 402A to improve its quality when a high-k material is used.

The gate electrode 402B of the access transistor 400 of substrate 401 is formed on the gate dielectric layer 402A and may consist of at least one P-type workfunction metal or N-type workfunction metal, depending on whether the transistor is to be a PMOS or an NMOS transistor. In some implementations, the gate electrode 402B may consist of a stack of two or more metal layers, where one or more metal layers are workfunction metal layers and at least one metal layer is a conductive fill layer.

For a PMOS transistor, metals that may be used for the gate electrode 402B include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode 402B may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode 402B may consist of one or more U-shaped metal layers formed atop one or more planar, non-U-shaped layers.

In some implementations of the invention, a pair of sidewall spacers 410 may be formed on opposing sides of the gate stack that bracket the gate stack. The sidewall spacers 410 may be formed from a material such as silicon nitride, silicon oxide, silicon carbide, silicon nitride doped with carbon, and silicon oxynitride. Processes for forming sidewall spacers are well known in the art and generally include deposition and etching process operations. In an alternate implementation, a plurality of spacer pairs may be used, for instance, two pairs, three pairs, or four pairs of sidewall spacers may be formed on opposing sides of the gate stack.

As is well known in the art, source region 404 and drain region 406 are formed within the substrate adjacent to the gate stack of each MOS transistor. The source region 404 and drain region 406 are generally formed using either an implantation/diffusion process or an etching/deposition process. In the former process, dopants such as boron, aluminum, antimony, phosphorous, or arsenic may be ion-implanted into the substrate to form the source region 404 and drain region 406. An annealing process that activates the dopants and causes them to diffuse further into the substrate typically follows the ion implantation process. In the latter process, the substrate 401 may first be etched to form recesses at the locations of the source and drain regions. An epitaxial deposition process may then be carried out to fill the recesses with material that is used to fabricate the source region 404 and drain region 406. In some implementations, the source region 404 and drain region 406 may be fabricated using a silicon alloy such as silicon germanium or silicon carbide. In some implementations, the epitaxially deposited silicon alloy may be doped in situ with dopants such as boron, arsenic, or phosphorous. In further embodiments, the source region 404 and drain region 406 may be formed using one or more alternate semiconductor materials such as germanium or a group III-V material or alloy. And in further embodiments, one or more layers of metal and/or metal alloys may be used to form the source region 404 and drain region 406. In the illustrative embodiment, an isolation 408 is adjacent to the source region 404, drain region 406 and portions of the substrate 401.

In an embodiment, a source contact 414 and a drain contact 416 are formed in a dielectric layer 411 and in the dielectric layer 412 above the gate electrode 402B. In the illustrative embodiment, a source metallization structure 424 is coupled with the source contact 414 and a gate metallization structure 426 is coupled with the gate contact 414. In the illustrated embodiment, a dielectric layer is adjacent to the gate contact 418, drain contact 416, source contact 414 and portions of the source metallization structure 424 and the gate metallization structure 426.

In an embodiment, the source contact 414, the drain contact 416 and gate contact 418 each include a multi-layer stack. In an embodiment, the multi-layer stack includes two or more distinct layers of metal such as a layer of Ti, Ru or Al and a conductive cap on the layer of metal. The conductive cap may include a material such as W or Cu. Metallization structures 424 and 426 and memory contact 428 may include a structure and materials that are substantially the same as the structure and materials of the conductive interconnect 304. In an embodiment, the conductive interconnect 304 includes a barrier layer 304A, such as tantalum nitride, and a fill metal 304B, such as copper, tungsten or ruthenium.

A dielectric layer 420 is adjacent to the dielectric spacer 330, and a portion of the electrode 120 of the pSTTM device 330. The dielectric layer 420 is also adjacent to portions of the source metallization structure 424, the gate metallization structure 426 and the memory contact 428.

Figure 5:
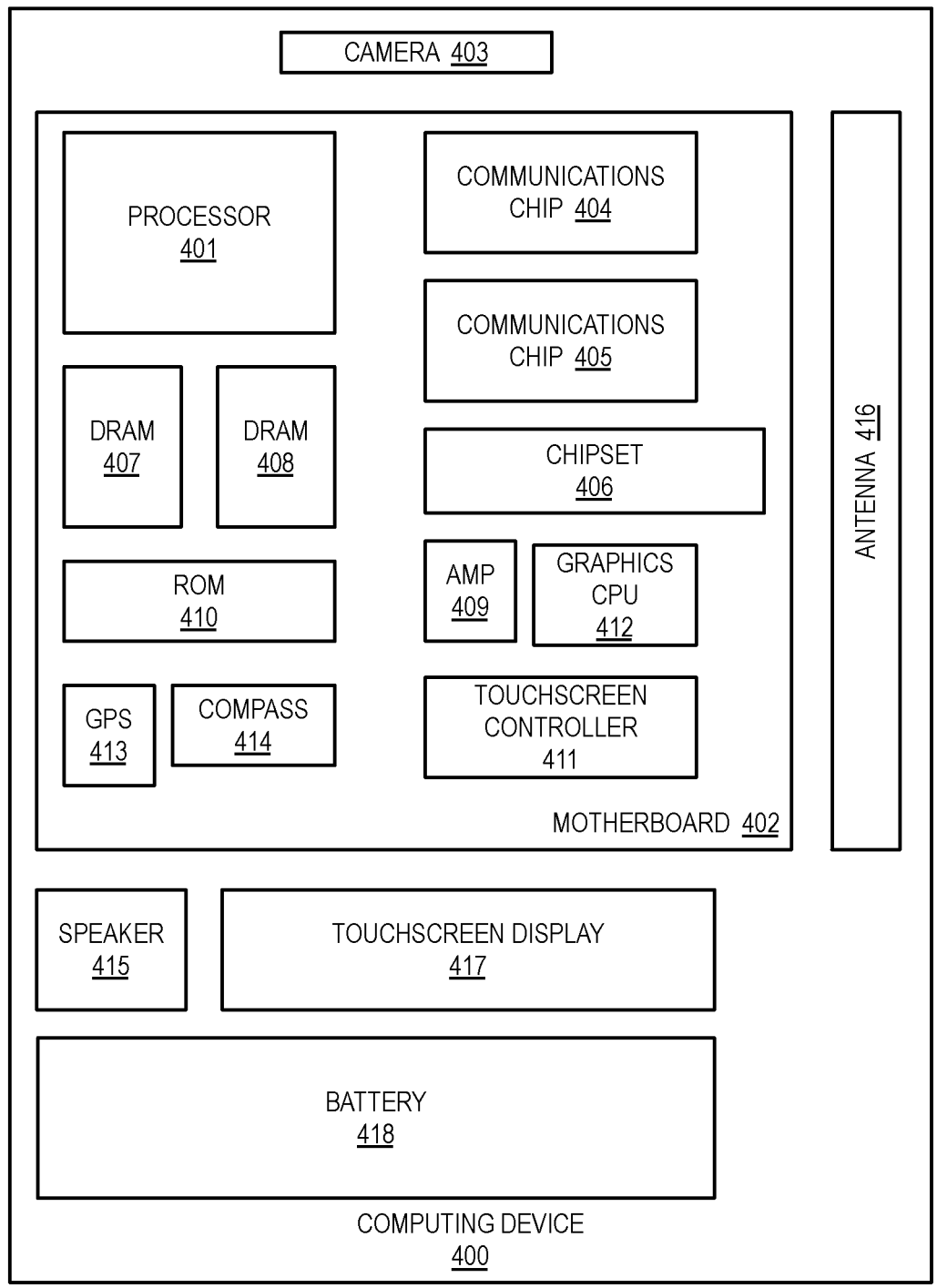
FIG. 5 illustrates a computing device in accordance with embodiments of the present disclosure.

The isolation 408, dielectric layer 412, 411, 302 and 420 may include any material that has sufficient dielectric strength to provide electrical isolation such as, but not, limited silicon dioxide, silicon nitride, silicon oxynitride, carbon doped nitride and carbon doped oxide. FIG. 5 illustrates a computing device 500 in accordance with embodiments of the present disclosure. As shown, computing device 500 houses a motherboard 502. Motherboard 502 may include a number of components, including but not limited to a processor 501 and at least one communication chip 505. Processor 501 is physically and electrically coupled to the motherboard 502. In some implementations, communication chip 505 is also physically and electrically coupled to motherboard 502. In further implementations, communication chip 505 is part of processor 501.

Depending on its applications, computing device 500 may include other components that may or may not be physically and electrically coupled to motherboard 502. These other components include, but are not limited to, volatile memory (e.g., DRAM), non-volatile memory (e.g., ROM), flash memory, a graphics processor, a digital signal processor, a crypto processor, a chipset 506, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communication chip 505 enables wireless communications for the transfer of data to and from computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 505 may implement any of a number of wireless standards or protocols, including but not limited to Wi-Fi (IEEE 802.11 family), WiMAX (IEEE 802.11 family), IEEE 802.10, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 500 may include a plurality of communication chips 504 and 505. For instance, a first communication chip 505 may be dedicated to shorter range wireless communications such as Wi-Fi and Bluetooth and a second communication chip 504 may be dedicated to longer range wireless communications such as GPS, EDGE, GPRS, CDMA, WiMAX, LTE, Ev-DO, and others.

Processor 501 of the computing device 500 includes an integrated circuit die packaged within processor 501. In some embodiments, the integrated circuit die of processor 501 includes a transistor 400 coupled with one at least one pSTTM memory device such as a pSTTM memory device 100A, pSTTM device 100B, pSTTM device 200A or pSTTM device 200B, where the pSTTM devices 100A, 100B, 200A, 200B each include skrymion follower 112. The term "processor" may refer to any device or portion of a device that processes electronic data from registers and/or memory to transform that electronic data into other electronic data that may be stored in registers and/or memory.

Communication chip 505 also includes an integrated circuit die packaged within communication chip 506. In another embodiment, the integrated circuit die of communication chips 504, 505 include a memory array with memory cells including pSTTM device 100A, 100B, 200A, 200B.

In various examples, one or more communication chips 504, 505 may also be physically and/or electrically coupled to the motherboard 502. In further implementations, communication chips 504 may be part of processor 501. Depending on its applications, computing device 500 may include other components that may or may not be physically and electrically coupled to motherboard 502. These other components may include, but are not limited to, volatile memory (e.g., DRAM) 507, 508, non-volatile memory (e.g., ROM) 510, a graphics CPU 512, flash memory, global positioning system (GPS) device 513, compass 514, a chipset 506, an antenna 516, a power amplifier 509, a touchscreen controller 511, a touchscreen display 517, a speaker 515, a camera 503, and a battery 518, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like. In further embodiments, any component housed within computing device 500 and discussed above may contain a stand-alone integrated circuit memory die that includes one or more arrays of memory cells and device structure 100, built in accordance with embodiments of the present disclosure.

In various implementations, the computing device 500 may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Figure 6:
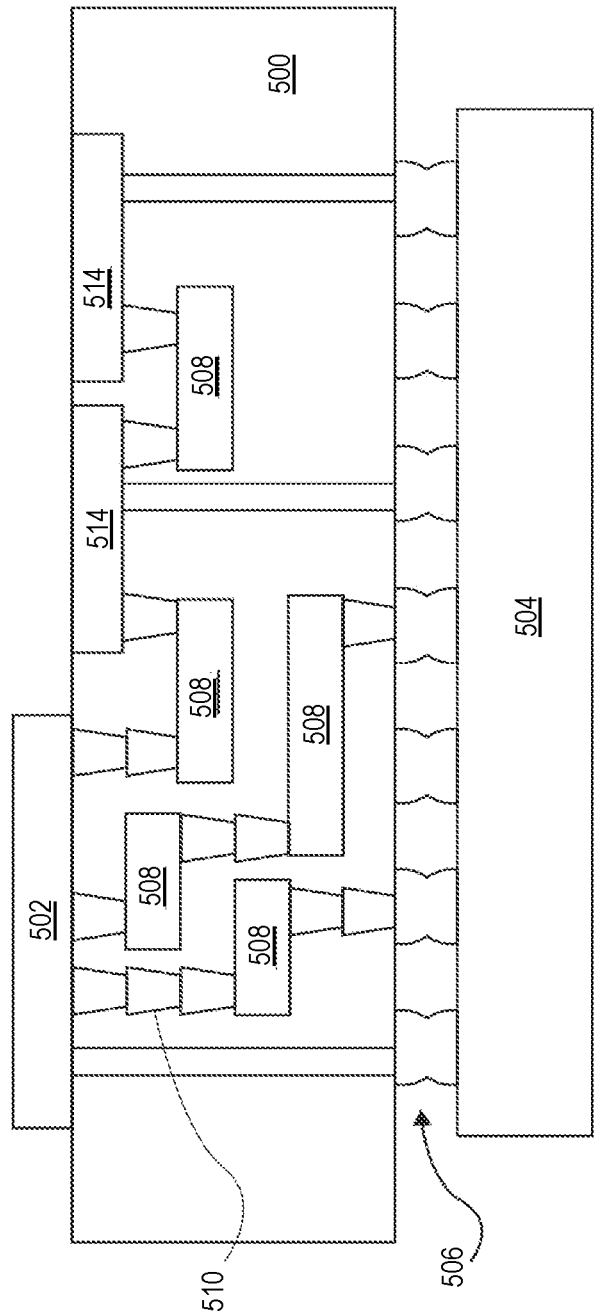
FIG. 6 illustrates an integrated circuit structure that includes one or more embodiments of the pSTTM device including a skrymion follower.

FIG. 6 illustrates an integrated circuit structure 600 that includes one or more embodiments of the disclosure. The integrated circuit (IC) structure 600 is an intervening structure used to bridge a first substrate 602 to a second substrate 604. The first substrate 602 may be, for instance, an integrated circuit die. The second substrate 604 may be, for instance, a memory module, a computer mother, or another integrated circuit die. The integrated circuit die may include one or more device systems such as a device structure including a transistor 400 coupled with a with one at least one pSTTM memory device such as a pSTTM device 100A, pSTTM device 100B, pSTTM device 200A or pSTTM device 200B, where the pSTTM devices 100A, 100B, 200A, 200B each include skrymion follower 112, for example. Generally, the purpose of an integrated circuit (IC) structure 600 is to spread a connection to a wider pitch or to reroute a connection to a different connection. For example, an integrated circuit (IC) structure 600 may couple an integrated circuit die to a ball grid array (BGA) 606 that can subsequently be coupled to the second substrate 604. In some embodiments, the first and second substrates 602/604 are attached to opposing sides of the integrated circuit (IC) structure 600. In other embodiments, the first and second substrates 602/604 are attached to the same side of the integrated circuit (IC) structure 600. And in further embodiments, three or more substrates are interconnected by way of the integrated circuit (IC) structure 600. The integrated circuit (IC) structure 600 may be formed of an epoxy resin, a fiberglass-reinforced epoxy resin, a ceramic material, or a polymer material such as polyimide. In further implementations, the integrated circuit (IC) structure 600 may be formed of alternate rigid or flexible materials that may include the same materials described above for use in a semiconductor substrate, such as silicon, germanium, and other group III-N, group III-V and group IV materials. The integrated circuit (IC) structure 600 may include metal interconnects 608 and via 610, including but not limited to through-silicon vias (TSVs) 610. The integrated circuit (IC) structure 600 may further include embedded devices 614, including both passive and active devices. Such devices include, but are not limited to, capacitors, decoupling capacitors, resistors, inductors, fuses, diodes, transformers, device structure including a transistor 400 coupled with a with one at least one pSTTM memory device such as a pSTTM memory device 100A, pSTTM device 100B, pSTTM device 200A or pSTTM device 200B, where the pSTTM devices 100A, 100B, 200A, 200B each include skrymion follower 112, for example, one or more resistive random-access devices, sensors, and electrostatic discharge (ESD) devices. More complex devices such as radio-frequency (RF) devices, power amplifiers, power management devices, antennas, arrays, sensors, and MEMS devices may also be formed on the integrated circuit (IC) structure 600. In accordance with embodiments of the present disclosure, apparatuses or processes disclosed herein may be used in the fabrication of integrated circuit (IC) structure 600.

As used in any implementation described herein, the term "module" refers to any combination of software, firmware and/or hardware configured to provide the functionality described herein. The software may be embodied as a software package, code and/or instruction set or instructions, and "hardware", as used in any implementation described herein, may include, for example, singly or in any combination, hardwired circuitry, programmable circuitry, state machine circuitry, and/or firmware that stores instructions executed by programmable circuitry. The modules may, collectively or individually, be embodied as circuitry that forms part of a larger system, for example, an integrated circuit (IC), system on-chip (SoC), and so forth.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure. Accordingly, one or more embodiments of the present disclosure relate generally to the fabrication of embedded microelectronic memory. The microelectronic memory may be non-volatile, wherein the memory can retain stored information even when not powered. One or more embodiments of the present disclosure relate to the fabrication of pSTTM devices 100A. Such pSTTM device 100A may be used in an embedded non-volatile memory application.

Specific embodiments are described herein with respect to pSTTM devices. It is to be appreciated that embodiments described herein may also be applicable to other non-volatile memory devices. Such non-volatile memory devices may include, but are not limited to, magnetic random access memory (MRAM) devices, in-plane spin torque transfer memory (STTM) devices and in plane or perpendicular spin orbit torque (SOT) memory devices. Thus, embodiments of the present disclosure include perpendicular-STTM (pSTTM) devices with enhanced stability and methods to form same.

What is claimed is:
1. A non-volatile memory device comprising:
   a first electrode;
   a second electrode;
   a free magnet between the first electrode and the second electrode;
   a fixed magnet between the first electrode and the second electrode;

a tunnel barrier between the free magnet and the fixed magnet;

a coupling layer between the free magnet and the first electrode, wherein the coupling layer comprise a metal and oxygen; and a follower between the coupling layer and the first electrode, wherein the follower comprises a magnetic skyrmion.

2. The non-volatile memory device of claim 1, wherein an average magnetic anisotropy of the magnetic skyrmion varies monotonically between perpendicular and in-plane over a radius of the follower.

3. The non-volatile memory device of claim 1, wherein a first annular region of the magnetic skyrmion has a perpendicular magnetic anisotropy, and a second annular region that surrounds the first annular region has an in-plane magnetic anisotropy.

4. The non-volatile memory device of claim 3, further comprising a third annular region that surrounds the second annular region, the third annular region having a magnetic anisoptropy that is between in plane magnetic anisotropy and perpendicular magnetic anisotropy.

5. The non-volatile memory device of claim 4, further comprising a fourth annular region that surrounds the third annular region, the fourth annular region having a perpendicular anisotropy and wherein the first annular region surrounds a core that has perpendicular magnetic anisotropy that is antiparallel to the perpendicular anisotropy of the fourth annular region.

6. The non-volatile memory device of claim 1, wherein the magnetic skyrmion is Bloch-type or Neel-type.

7. The non-volatile memory device of claim 1, wherein the follower comprises a first layer comprising a magnetic material and a second layer between the first electrode and the first layer, the second layer comprising a material with a strong spin-orbit coupling effect.

8. The non-volatile memory device of claim 7, wherein the first layer comprises cobalt, iron or an alloy of cobalt and iron.

9. The non-volatile memory device of claim 7, wherein the second layer comprises at least one of nickel, silicon, aluminum, platinum, iridium, tungsten, bismuth, gold, osmium, rhenium or lead.

10. The non-volatile memory device of claim 7, wherein the first layer comprises iron and the second layer comprises at least one of iridium, aluminum, silicon or nickel.

11. The non-volatile memory device of claim 8, wherein the first layer comprises cobalt and the second layer comprises nickel.

12. The non-volatile memory device of claim 1, wherein the first layer has a thickness between 2 nm-3 nm and the second layer has a thickness between 1 nm-2 nm.

13. The non-volatile memory device of claim 1, wherein the follower is an alloy comprising iron and at least one of iridium, aluminum, silicon or nickel, or an alloy comprising cobalt and iron, or an alloy comprising cobalt and nickel.

14. The non-volatile memory device of claim 1, wherein the coupling layer is approximately 10-1000 times more electrically conductive than the tunnel barrier.

15. The non-volatile memory device of claim 1, wherein the free magnet and the fixed magnet comprise cobalt, boron and iron and the tunnel barrier comprises magnesium and oxygen.

16. An apparatus comprising:
a transistor above a substrate, the transistor comprising:
a gate;
a source and a drain;
a drain contact coupled with the gate drain;
a source contact coupled with the source;
a gate contact coupled with the gate; and
a non-volatile memory device coupled to the drain electrode, the non-volatile memory device comprising:
a first electrode;
a second electrode;
a free magnet between the first electrode and the second electrode;
a fixed magnet between the first electrode and the second electrode;
a tunnel barrier between the free magnet and the fixed magnet;
a coupling layer between the free magnet and the first electrode, wherein the coupling layer comprise a metal and oxygen; and
a follower between the coupling layer and the first electrode, wherein the follower comprises a magnetic skyrmion.

17. The non-volatile memory device of claim 16, wherein an average magnetic anisotropy of the magnetic skyrmion varies monotonically between perpendicular and in-plane over a radius of the follower.

* * * * *